United States Patent
Aldridge et al.

(10) Patent No.: US 7,124,351 B2
(45) Date of Patent: Oct. 17, 2006

(54) SOFTWARE INSTRUCTIONS UTILIZING A HARDWIRED CIRCUIT

(75) Inventors: Christopher Aldridge, Singapore (SG); Mridula Pradhan, Singapore (SG); Chong Yee Lee, Singapore (SG)

(73) Assignees: STMicroelectronics Asia Pacific Pte. Ltd., Singapore (SG); National University of Singapore, Singapore (SG)

( * ) Notice: Subject to any disclaimer, the term of this patent is extended or adjusted under 35 U.S.C. 154(b) by 408 days.

(21) Appl. No.: 10/729,828

(22) Filed: Dec. 4, 2003

(65) Prior Publication Data

US 2004/0199849 A1  Oct. 7, 2004

(30) Foreign Application Priority Data

Dec. 4, 2002  (SG) ............................. 200207431-8

(51) Int. Cl.
*H03M 13/00* (2006.01)
(52) U.S. Cl. ....................... 714/781; 714/758
(58) Field of Classification Search ............... 714/759, 714/781, 758, 757, 782, 783, 784
See application file for complete search history.

(56) References Cited

U.S. PATENT DOCUMENTS

| | | | | |
|---|---|---|---|---|
| 5,517,512 A | * | 5/1996 | Saegusa | 714/759 |
| 6,192,498 B1 | * | 2/2001 | Arato | 714/781 |
| 6,530,057 B1 | * | 3/2003 | Kimmitt | 714/758 |
| 6,820,232 B1 | * | 11/2004 | Kim et al. | 714/781 |
| 6,836,869 B1 | * | 12/2004 | Wyland | 714/781 |

* cited by examiner

*Primary Examiner*—David Ton
(74) *Attorney, Agent, or Firm*—Lisa K. Jorgenson; Robert Iannucci; Seed IP Law Group PLLC

(57) ABSTRACT

A method of calculating a Cyclic Redundancy Check (CRC) value for a multi-bit input data word, using a defined generator polynomial is disclosed. The method includes the steps of: serially shifting at least a portion of the input data word into a register; XORing the contents of the register with the generator polynomial if the LSB of the register is '1'; shifting the contents of the register right by one position; shifting into the MSB position of the register a new bit of the input data word, having been XORed with the LSB of the register; repeating the previous step for all message data bits; shifting into the register a number of '0's equal to the length of the generator polynomial; reading from the register the calculated CRC value. Apparatus for performing the method is also disclosed.

11 Claims, 3 Drawing Sheets

SOFTWARE INSTRUCTIONS UTILIZING A HARDWIRED CIRCUIT

BACKGROUND OF THE INVENTION

1. Field of the Invention

The present invention relates to a circuit arranged to perform a cyclic redundancy check (CRC) on a received data stream. The circuit may additionally be used to perform other forms of coding on selected data.

2. Description of the Related Art

Error coding is often added to data when there is a possibility that the data may be corrupted or otherwise interfered with during transmission. Simple error coding may include simply adding a parity bit which indicates to the receiver that the data received is not identical with the data transmitted. However, such simple schemes do not protect for cases where more than a single bit is at fault. This can pose problems when, in reality, a burst error may corrupt several bits in a message.

Cyclic Redundancy Checking (CRC) is one form of error checking employed in a wide variety of data traffic systems. CRC uses a system of polynomial division to code a given string of data.

For example, assume the message to be transmitted is a multi-bit message, $M(D).D^N$. This message is divided, using modulo-2 arithmetic, by a so-called generator polynomial, $G(D)$. This division yields a division polynomial, $Y(D)$, and a remainder polynomial $R(D)$.

$$\frac{M(D).D^N}{G(D)} = Y(D) + R(D) \qquad (1)$$

The long division process (normal, or modulo-2 for polynomials) yields $Y(D)$ and $R(D)$ as two separate outputs. In practice, only the remainder, $R(D)$, is of interest, and $Y(D)$ is discarded. The message, $M(D)$ is then normally appended by N zero digits, or simply shifted left N positions, where N is the order of the generator polynomial, $G(D)$. The data that is transmitted is therefore: $M(D).D^N+R(D)$.

The data may be transmitted over any one of a number of different interfaces. During the course of the transmission, an error $E(D)$ may occur. The error may affect one or more bits of the message, which means that the receiver will receive $M(D).D^N+R(D)+E(D)$.

In order to verify the authenticity of the received data, the receiver divides the received data by the same generator polynomial, $G(D)$.

$$\frac{M(D).D^N + R(D) + E(D)}{G(D)} = \frac{M(D).D^N}{G(D)} + \frac{R(D)}{G(D)} + \frac{E(D)}{G(D)} \qquad (2)$$

The first term in the result of equation (2) yields $Y(D)$ and $R(D)$ as before. The term $R(D)/G(D)$ yields just the remainder $R(D)$. The term $E(D)/G(D)$ yields $e(D)$ and $r(D)$ which represent the errors introduced by $E(D)$.

The result of the division by the receiver, may therefore be written as:

$$(Y(D)+e(D))+R(D)+R(D)+r(D) \qquad (3)$$

$Y(D)$ is not significant, as before, and may simply be discarded. The same is true for $e(D)$, which is the result of $E(D)$ divided by $G(D)$. In practice, $Y(D)$ and $e(D)$ are combined and cannot be separated.

Accordingly, if no error $E(D)$ has occurred during transmission, then $r(D)$ is zero. If an error $E(D)$ has occurred, then $r(D)$ will have a non-zero value. In such a case, the receiver may choose to ignore the received data, flag it as erroneous and/or request a re-transmission.

As an example of this procedure, consider a binary stream of 192 bits: {1011 . . . 011}. Representing this as a polynomial already appended (or shifted) with eights '0's to take into account the order of the generator, $G(D)$:

$$1.D^{199}+0.D^{198}+1.D^{197}+1.D^{196}+ \ldots +0.D^{10}+1.D^9+ \\ 1.D^8+0.D^7+0.D^6+0.D^5+ \ldots +0.D^1+0.D+0.D^0 \qquad (4)$$

The generator polynomial, $G(D)$, of order $N=8$, in this case is:

$$D^8+D^7+D^4+D^3+D^1+D^0 \qquad (5)$$

In hardware, the modulo-2 division may be implemented as shown in FIG. 1. FIG. 1 shows a circuit 20, including a string of sequentially connected registers 22. An XOR gate 24 is interposed between adjacent shift registers at the appropriate positions to realize the algorithm of equation (5).

The data to be encoded is shifted into the coder 20 as shown in FIG. 1. After all the data bits have been shifted into the coder, a sequence of zero bits are shifted in. The sequence consists of as many zero bits as there are bits in the coder. In the present case, the sequence of zero bits is 8 bits long.

After the sequence of zero bits has been loaded into the coder, the coder 20 contains the remainder $R(D)$ of the coding division process.

The same coder circuit may be used for encoding and decoding. For encoding, the procedure is as described above. For decoding received data, the message data is first shifted into the coder 20, followed by the received remainder, $R(D)$. If the coder 20 stores a zero value after the remainder has been shifted in, this indicates that the message and remainder sequence were received without error. A non-zero result indicates that either the message or remainder contains an error.

The CRC function can also be implemented in software. The following code demonstrates a prior art realization.

```
for (i=0; i<data_len; i++)
{
    C=M[i];           //Get the next input data bit
    C= C ^CRC[0];     //XOR data bit with LSB of CRC register
    if (CRC[0]==1)
    {
            for (j=0; j<CRC_len; j++)
            {
                    CRC[j] = CRC[j] ^CRC_poly[j];
                    //XOR CRC bits with generator polynomial bits
            }
    }
    //Shift CRC register bits right by one position
    for (j=0; j<CRC_len - 1; j++)
    {
            CRC[j] = CRC[j+1];
    }
    CRC[CRC_len - 1] = C//C becomes the new MSB of CRC register
}
```

From the code above, it is evident that using a normal DSP (Digital Signal Processor) or MCU (Microprocessor Unit), a total of 3–5 instruction cycles would be required each time the LSB of the CRC register is checked for a '1', performing the XOR and shift operations. The speed of this operation is further reduced when the length of the CRC register is higher than the data width of the processor or DSP accumulators, which are normally 8, 16, 24 or 32 bits. In such cases, two or more sets of XOR and shift are required.

BRIEF SUMMARY OF THE INVENTION

According to a first aspect of the present invention, there is provided a method of calculating a Cyclic Redundancy Check (CRC) value for a multi-bit input data word, comprising a defined generator polynomial, including the steps of:
 a) serially shifting at least a portion of the input data word into a register;
 b) XORing the contents of the register with the generator polynomial if the LSB of the register is '1';
 c) shifting the contents of the register right by one position;
 d) shifting into the MSB position of the register a new bit of the input data word, having been XORed with the LSB of the register;
 e) repeating step d) for all message data bits;
 f) shifting into the register a number of '0's equal to the length of the generator polynomial; and reading from the register the calculated CRC value.

According to a second aspect of the present invention, there is provided an apparatus for calculating a Cyclic Redundancy Check (CRC) value for a multi-bit input data word, using a defined generator polynomial, including:
 a register for serially receiving at least a portion of the input data word;
 an XOR gate for XORing the contents of the register with the generator polynomial if the LSB of the register is '1';
 means for shifting the contents of the register right by one position;
 means for repeatedly shifting into the MSB position of the register a new bit of the input data word, having been XORed with LSB of the register, until all bits of the input data word have been shifted into the register; and
 means for shifting into the register a number of '0's equal to the length of the generator polynomial.

Embodiments of the invention may be used to perform CRC calculations on data quickly and efficiently as they may be implemented in an MCU such that the calculations are completed in a few clock cycles using specialized hardware which may be called by an appropriate instruction in software.

The basic apparatus and circuit may further be used in a variety of different coding schemes including Turbo coding, PN sequence generation and convolutional coding. Such coding schemes benefit from the more speedy execution achieved through use of the custom hardware provided.

BRIEF DESCRIPTION OF THE DRAWINGS

For a better understanding of the present invention and to understand how the same may be brought into effect, the invention will now be described by way of example only, with reference to the appended drawings in which.

DETAILED DESCRIPTION OF THE INVENTION

Hamming distance is defined as the number of occurrences of bit differences between two variables. For a modulo-2 case, the hamming distance is defined as the number of bit positions in which the corresponding bits of two binary words of the same length are different. This can be calculated by XORing the individual bits and counting the number of occurrences of differences. As an example, the hamming distance between 1011101 and 1001001 is two.

Figure 1:
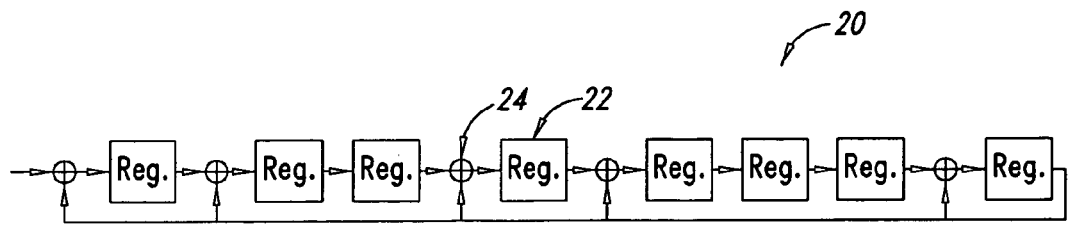
FIG. 1 shows a string of registers for implementing a generator polynomial.
Figure 2:
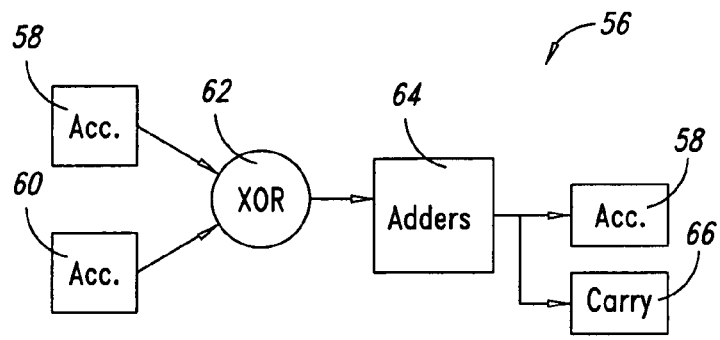
FIG. 2 shows an arrangement for calculating a hamming distance.

FIG. 2 shows the hardware realization of a function herein titled WEIGHT( ). The WEIGHT( ) function calculates the hamming distance between two variables input to the circuit. The circuit includes a first accumulator 58, a second accumulator 60, an XOR gate 62 and a cascade of adders 64.

The result of the calculation is stored back into the first accumulator 58. Additionally, a carry flag 66 is provided. The carry flag stores the parity of the result, and is set to '0' if even, or '1' if odd.

The circuit of FIG. 2 has another use. When one of the accumulators stores a zero value, the output written back to the first accumulator is equal to the number of '1's in the other accumulator. This function is sometimes referred to as a 'majority vote'.

Figure 3:
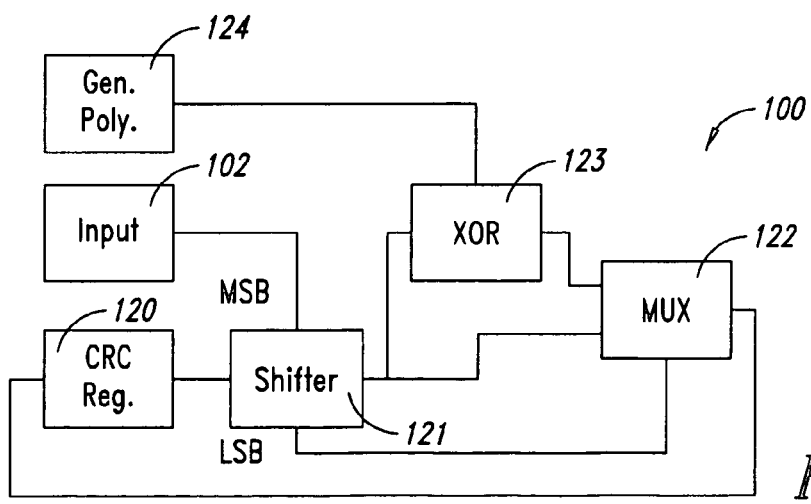
FIG. 3 shows an arrangement for computing CRC.

The circuit 100 shown in FIG. 3 is used to compute the CRC for a message sequence provided as an input. The message sequence 102 is shifted bit-by-bit serially into the MSB of the shifter 121 and concatenated with the CRC register 120. The contents of the CRC register are shifted right by one position and the CRC register is updated after each shift operation. If the LSB of the shifter 121 is a '1', then the output of the shifter 121 is XORed by XOR gate 123 with the Generator Polynomial 124, else no XOR operation is performed. The 2–1 MUX 122 controls whether an XOR operation is performed or not, under the control of the LSB of the shifter 121.

This process is repeated for all the message data bits, after which a number of '0's equal to the length of the generator polynomial are shifted into the CRC register. After the message sequence and sequence of '0's have been shifted in, the result contained in the CRC register is the remainder of the division.

The remainder is read from the CRC register in reverse bit order. The generator polynomial is also programmed in reverse bit order, and the MSB of the generator polynomial is not included.

Implementing a CRC function in software in the prior art requires several steps to perform the necessary shift, compare and XOR functions. Moreover, the task is repeated as many times as there are incoming data bits, making the process slow for large data words.

Embodiments of the present invention provide hardwired instructions which allow software calls to be made to specialized hardware which results in the process being performed significantly more speedily, thus freeing up the processor to perform other tasks. The specialized hardware is provided as part of an MCU or DSP, which is thus able to offer specialized commands for performing CRC calculations. Such commands may be implemented more speedily in such a specialized processor than in a general purpose processor as the specialized hardware can perform the required calculations in fewer instruction cycles.

For the CRC function, the hardware is implemented in such a way that cascading may be used to calculate the CRC for data words having a greater width than the accumulator of the MCU. For instance, if the MCU has a 16-bit accumulator, cascading may be used to allow the CRC to be calculated for a data word wider than 16-bits.

Figure 4:
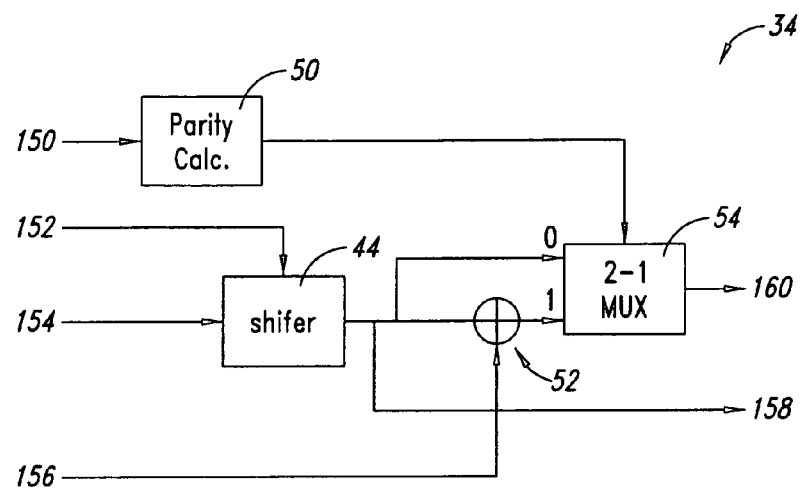
FIG. 4 shows a hardwired arrangement for computing CRC.

The hardware function is implemented as shown in FIG. 4. Four inputs are required for circuit 34. The auxiliary input 150, the generator 156, the CRC register 154 and the carry flag 152. They are shown as feeding into the circuit of FIG. 4. The CRC parity check, CRC register and generator are 16 bits wide in this particular embodiment. The carry bit is 1-bit wide.

Circuit 50 extracts the LSB of the CRC register by calculating the parity of the auxiliary input. The auxiliary input is a copy of the CRC register that has been processed by software in the MCU by masking the CRC LSB position. The hardware is implemented in this way, rather than simply extracting the LSB from the CRC register, so that a CRC may be calculated that is not aligned to the word length of the CRC register, where the LSB of the CRC register may be in the middle of the word. This implementation also allows hardware to be easily used in other coding applications outlined below.

If the parity output from circuit 50 is determined to be odd, the new value of the CRC register becomes {Carry Flag, CRC register [m:1]}, and this is XORed with Generator [m:0]. If the parity output from circuit 50 is even, then the new value of CRC register is {Carry Flag, CRC register [m:1]}, and no XOR operation occurs.

For either odd or even parity, the new value of Carry Flag is simply CRC register[0].

A typical implementation of the circuit shown in FIG. 4 uses an m-bit wide dual input multiplexer 54, an m-bit input XOR gate as the parity checker circuit 50 to perform the parity check, and m dual input XOR gates 52 for performing the XOR operation. Circuit 44 shifts the bits of the CRC register 154 by one position and shifts in the carry flag 152 as the MSB of the CRC register. The outputs of FIG. 4 are a new carry flag 158 and a new value of the CRC register 160.

The hardwired instruction may be called from software using a suitably defined command, such as CRC(&A, &Tn, &C, #value), where &A represents the LSB of the CRC register, &Tn represents all bits of the CRC register, &C represents the carry flag and #value represents the generator polynomial.

If the Generator Polynomial, G(D), is $D^{16}+D^{12}+D^3+D^1+D^0$, this is coded into #value as [1101 0000 0000 1000]. It is coded in reverse order from $D^0$ to $D^{15}$, the value of $D^{16}$ is assumed by the hardware.

The following code describes how such a command may be used to calculate the CRC for a 16-bit input word, where the accumulator of the MCU is also 16-bit

| Step | | |
|---|---|---|
| 1 | Tn = 0 | //Initialize CRC register |
| 2 | C = incoming message bit | |

-continued

| Step | | |
|---|---|---|
| 3 | A = Tn & 1 | //Set A = LSB of CRC register by masking //LSB using AND operator |
| 4 | CRC(&A, &Tn, &C, #value) | //Call the hardwired CRC instruction |

Steps 2 to 4 are then repeated for all sixteen message data bits. After these steps, sixteen '0's are shifted into the CRC register, and the value remaining in the CRC register after this operation is the required CRC.

In the case where the CRC is to be calculated for a word wider than the width of the accumulator, the hardwired CRC instruction is called twice. This scenario is illustrated in the code set out below for a 21-bit data word.

The CRC register is mapped to two registers

| | |
|---|---|
| CRC[21:5] | Tn1[15:0] |
| CRC[4:0] | Tn2[15:11], where Tn2[11] is the LSB |

An arbitrary generator polynomial, G(D), may be defined as $D^{21}+D^{20}+D^{19}+D^{17}+D^{12}+D^{11}+D^7+D^6+D^3+D^1+D^0$. This polynomial is coded onto #value1 and #value2 as:

| | |
|---|---|
| value1: | [1101 0011 0001 1000] |
| value2: | [0101 1000 0000 0000] |

As before, this is coded in reverse order from $D^0$ to $D^{20}$, with $D^{21}$ being assumed by the hardware embodiment.

The code to realize the CRC calculation is:

| Step | | |
|---|---|---|
| 1 | Tn1 = 0 | //Initialize upper word of CRC register |
| 2 | Tn2 = 0 | //Initialize lower word of CRC register |
| 3 | C = incoming data bit | |
| 4 | A = Tn2 & 0x0800 | //Set A = LSB of CRC register using AND//function. Note that LSB is located at bit//11 of Tn2 |
| 5 | CRC(&A, &Tn1, &C, #value1) | //Call the hardwired CRC instruction |
| 6 | CRC(&A, &Tn2, &C, #value2) | //Call the hardwired CRC instruction |

As previously, the steps 3 to 6 are repeated for all bits of the input data word.

The above technique can be adapted for any length of input word, by mapping the word onto as many 16-bit registers as are required to hold the entire word. Of course, if the accumulator is wider than 16-bits, it will be capable of processing input words of greater width.

It is possible to define two versions of the CRC instruction to deal with different situations where data may need to bit-shifted to the left or the right. This may be useful in calculating CRC according to different standards which require different data structures. The only difference between their implementations is in the configuration of the bit-shifters which either shift to the left or to the right, and swap the MSB with the LSB and vice-versa. The remaining details are identical.

Each implementation may be called from software using a unique command, such as CRCR( ) for the right shifting version, and CRCL( ) for the left shifting version.

Aside from being used to calculate CRC, the basic circuit according to embodiments of the invention may be used in other applications including Pseudo Noise (PN) generators, Turbo coding and Convolutional Coding.

The generation of a PN sequence may be achieved by use of the hardwired CRC and WEIGHT instructions preciously defined. To generate a PN sequence, the following steps are performed:
(i) XOR'ing the PN register with an Output Generator Polynomial to produce an output;
(ii) Calculating a feedback bit by XOR'ing the PN register with. a Feedback Generator Polynomial;
(iii) Shifting the contents of the PN register right by one position; and
(iv) Shifting the feedback bit into the MSB position of the PN register.

Figure 5:
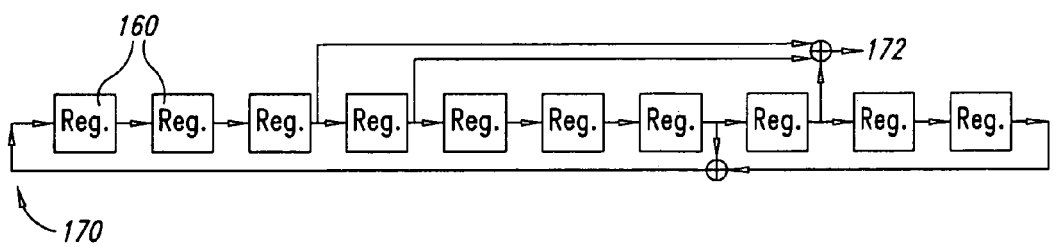
FIG. 5 shows an arrangement for generating a PN sequence.

FIG. 5 shows how step (ii) above is performed. FIG. 5 shows a string of sequentially connected register 160. A feedback signal 170 is created by combining selected register outputs to feedback to the MSB register. The output 172 is created by XORing selected register outputs. The register outputs used to create the feedback and output signals are selected on the basis of a defined generator polynomial.

The code below demonstrates how the hardwired instructions CRC( ) and WEIGHT( ) are used in the production of a PN sequence.

| | |
|---|---|
| $T_0$ | Is used for the PN shift register. The MSB of the register is aligned to $T_0[15]$ and the LSB is aligned to $T_0[6]$. |
| Y | Temporary PN register used for computing the output and feedback values. |
| $T_1$ | Generator polynomial taps for the PN generator output. The MSB of the taps is aligned to $T_1[15]$ and the LSB is aligned to $T_1[6]$. |
| $T_2$ | Generator polynomial taps for the feedback. The MSB of the taps is aligned to $T_2[15]$ and the LSB is aligned to $T_2[6]$. |
| $X_n$ | Pointer to PN generator output array. |
| C | Carry or parity bit output of Weight function. |
| #value | Is always set to 0x8000 as only the incoming bit has to be XOR'ed. |
| Z | Is used as input to CRC( ) function and is always set to 0. |

The following code is written in terms of the variables defined above:

| Step | | |
|---|---|---|
| 1 | $T_0 = 0$ | //Initialize PN register |
| 2 | $Z = 0$ | //Initialize input for CRC( ), always set to zero as no XOR required |
| 3 | #value = 0x8000 | //Initialize input for CRC( ) |
| 4 | $T_1 = 0x3100$ | //initialize taps for output as shown in FIG. 5 |
| 5 | $T_2 = 0x0240$ | //Initialize taps for feedback as shown in FIG. 5 |
| 6 | $Y = T_0$ | //To calculate the output - STEP #1 |
| 7 | Y &= 0XFFC0 | //Masking unused bits of register |
| 8 | WEIGHT (Y, $T_1$) | //Store parity in Y for PN output |

-continued

| Step | | |
|---|---|---|
| 9 | *$X_n$++ = C | //Output is equal to the Carry or Parity bit of Weight function |
| 10 | $Y = T_0$; | //For shifting new value into $T_0[15]$ - STEP #2 |
| 11 | Y &= 0xFFC0 | //Masking unused bits of register |
| 12 | WEIGHT (Y, $T_2$) | //Store parity of feedback bits in C |
| 13 | CRCR(Z, $T_0$, C, #value) | //Shift a 1 or 0 into MSB of $T_0$ depending value of C |

Steps 6 to 13 are repeated for the required PN sequence length.

In examples of the invention where the PN register length (N) is greater than 16, two or more 16-bit registers are used to represent the PN register and two or more 16-bit registers are used represent the generator polynomial, in a similar way as described previously for calculating the CRC for a data word of greater width than the accumulator. In such a case the WEIGHT( ) and CRCR( ) instructions are called more than once as required.

Figure 6:
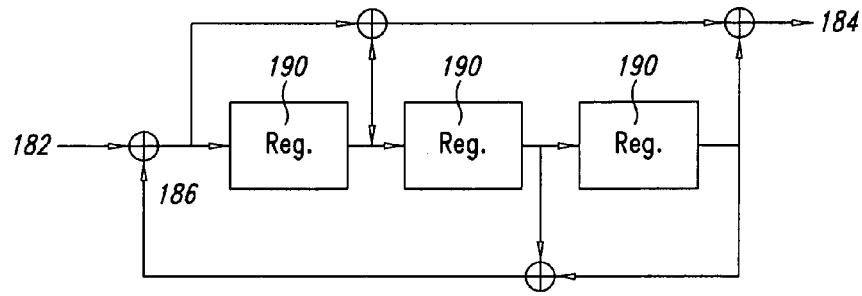
FIG. 6 shows an arrangement for a Turbo Encoder.

The WEIGHT( ) and CRC( ) commands can be used to implement a Turbo encoder. The hardware implementation of such an encoder is shown in FIG. 6. The circuit 180 is arranged to receive successive input bits 182, and to produce a stream of output bits 184. The input is fed into the first of a string of sequentially connected registers 190, and the output is derived from the last in the same string of registers. Various feedback signals are combined using XOR gates to encode the input data stream.

The principle behind Turbo encoding is to receive an input bit 182, calculate a feedback bit 186, shift the contents of the Turbo register and then calculate the output bit 184. This process is repeated as new data input bits are shifted into the circuit.

The code below demonstrates how such a function may be realized using the CRC( ) and WEIGHT( ) commands described previously:

| | |
|---|---|
| $T_0$ | Is used for the Turbo shift register. The MSB of the register is aligned to $T_0[15]$ and the LSB is aligned to $T_0[12]$. |
| Y | Temporary Turbo register used for computing the output and feedback parity values. |
| Z | Is used to store the parity of feedback bits. |
| T1 | Generator polynomial taps for the feedback. The MSB of the taps is aligned to $T_1[15]$ and the LSB is aligned to $T_1[12]$. |
| T2 | Generator polynomial taps for the Turbo encoder output. The MSB of the taps is aligned to $T_2[15]$ and the LSB is aligned to $T_2[12]$. |
| $X_n$ | Pointer to Turbo encoder output array. |
| C | Carry or parity bit output of Weight function. |
| #value | Is always set to 0x8000 as only the incoming bit has to be XORed. |

The following steps are executed:

| Step | | |
|---|---|---|
| 1 | $T_0 = 0$ | //Initialize Turbo register |
| 2 | $T_1 = 0x3000$ | //Initialize taps for feedback as shown in FIG. 6 |
| 3 | $T_2 = 0xD000$ | //Initialize taps for output as shown in FIG. 6 |

-continued

| Step | | | |
|---|---|---|---|
| 4 | #value = 0x8000 | //Initialize #value for CRC( ) function |
| 5 | Y = $T_0$ | //To calculate the output - STEP #1 |
| 6 | Y &= 0xF000 | //Mask the unused bits of the register |
| 7 | WEIGHT (Y, $T_1$) | //Store parity of feedback bits in C |
| 8 | Z = C | //Z equals to C and becomes input for CRC( ) function |
| 9 | C = Incoming bit | //Get next input bit |
| 10 | CRCR(Z, $T_0$, C, #value) | //Shift $T_0$ right by one position and shift in new MSB |
| 11 | Y = T0 | //To calculate the output bit - STEP #2 |
| 12 | Y &= 0xF000 | //Mask the unused bits of the register |
| 13 | WEIGHT (Y, $T_2$) | //Store parity in C |
| 14 | *$X_n$++ = C | //C is the output of the Turbo encoder |

Steps 5 to 14 are repeated for all the data bits to be encoded.

Figure 7:
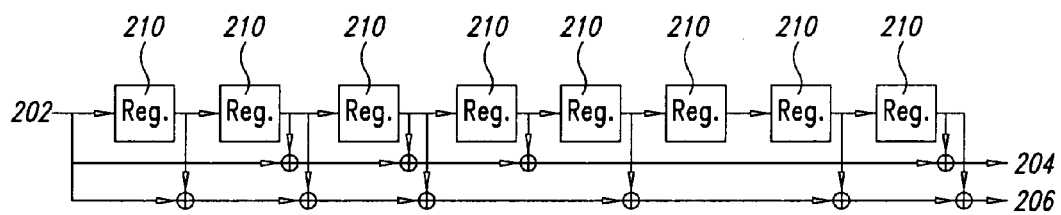
FIG. 7 shows an arrangement for a convolutional encoder.

A convolutional encoder can also be implemented using the CRC( ) and WEIGHT( ) commands. FIG. 7 shows a representation of a convolutional encoder (half-rate, constraint length nine) 200. It includes a series of sequentially connected registers 210. The first register in the string, is arranged to receive the input data bits 202. The two output data streams 204, 206 are created by XORing certain register outputs as defined by the generator polynomial. New data bits 182 are fed into the series of registers 210 such that each new bit forms the MSB of the word defined by the registers.

In the embodiment presented here, the WEIGHT( ) command is used to calculate the output bits and the CRC( ) command is used to shift the register bits right by one position.

| | |
|---|---|
| $T_0$ | Is used for the convolutional shift register. The MSB of the register is aligned to $T_0$[15] and the LSB is aligned to $T_0$[8]. |
| A | Is set to zero as the XOR operation is not required because the CRC( ) instruction is used only for right shift for implementing the convolutional encoder. |
| #value | Is of no consequence since A is set to zero and no XOR function is to be performed. |
| Y | Temporary convolutional register used for computing the output values. |
| $T_1$ | Generator polynomial taps for the first encoder output. The MSB of the taps is aligned to $T_1$[15] and $T_1$ is set to 0x3880. |
| $T_2$ | Generator polynomial taps for the second encoder output. The MSB of the taps is aligned to $T_2$[15] and $T_2$ is set to 0x7580. |
| C | Carry or parity bit output of Weight function. |
| $X_n$ | Pointer to convolutional encoder output array. |

The following steps are executed:

| Step | | | |
|---|---|---|---|
| 1 | $T_0$ = 0 | //Initialize Convolutional register |
| 2 | C = incoming message bit | |
| 3 | A = 0 | //XOR function not required |
| 4 | CRCR(A, $T_0$, C, #value) | //Shift C into MSB position of $T_0$. No XOR to be performed. |
| 5 | Y = $T_0$ | |

-continued

| Step | | | |
|---|---|---|---|
| 6 | Y &= 0xFF80 | //Constraint length 9, masking not required bits |
| 7 | WEIGHT(Y, $T_1$) | //Store Hamming distance in Y for first output |
| 8 | *$X_n$++ = C | //Output is equal to the Carry or Parity bit of WEIGHT( ) function |
| 9 | Y = $T_0$ | |
| 10 | Y &= 0xFF80 | //Constraint length 9, masking not required bits |
| 11 | WEIGHT(Y, $T_2$) | //Store Hamming distance in Y for second output |
| 12 | *$X_n$++ = C | //Output is equal to the Carry or Parity bit of Weight function |

Steps 2 to 12 are repeated for all the data bits to be encoded.

Thus, it can be seen that by the provision of specialized hardwired instructions in an MCU, simple software routines may be developed which allow CRC calculations to be easily and quickly performed.

The basic hardware required to perform CRC calculations, which may be called in software, may further be used as a building block to perform the other forms of complex coding described above. Indeed, other coding schemes not herein described may be produced using the same techniques.

Figure 8:
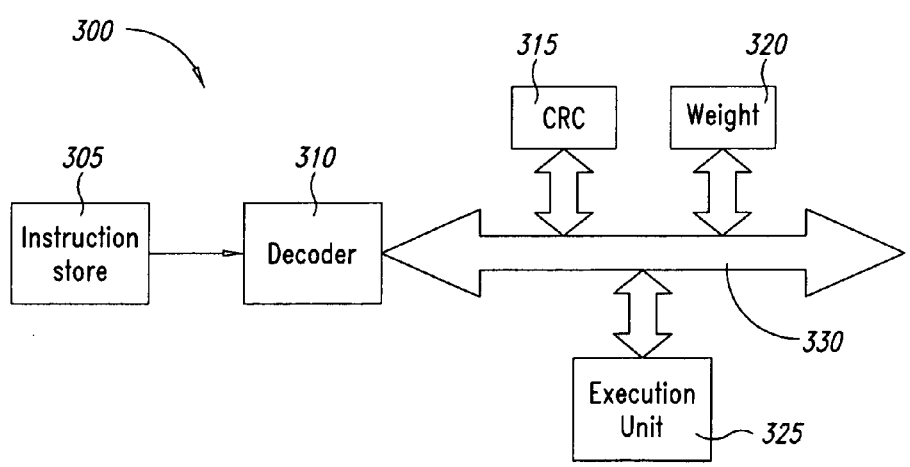
FIG. 8 is a block diagram of microprocessor unit according to one embodiment of the present invention.

Shown in FIG. 8 is a block diagram of a microprocessor unit 300 that implements an embodiment of the present invention. The microprocessor unit 300 includes an instruction storage unit 305 that stores software instructions to be executed. The software instruction may include both basic instructions and parameters acted on by the instructions. For example, the CRC instruction discussed above may include the &A, &Tn, &C, and #value parameters. The instruction storage unit 305 may be a buffer or other memory that stores all or part of the instructions of a computer program.

The microprocessor unit 300 also includes a decoder 310, a CRC hardwired circuit 315, a Weight hardwired circuit 320, and an execution unit 325 interconnected by a bus 330. The decoder 310 receives an instruction from the instruction storage unit 305, determines whether the instruction is a standard instruction or one of the CRC and Weight instructions discussed above. If the received instruction is a standard instruction, the decoder 310 passes the instruction on the bus 330 to the execution unit 325 which executes the instruction normally. If the received instruction is the CRC instruction, the decoder 310 passes the instruction to the CRC hardwired circuit 315, which implements the CRC instruction in hardware as discussed above with respect to FIGS. 3–4. If the received instruction is the Weight instruction, the decoder 310 passes the instruction to the Weight hardwired circuit 320, which implements the Weight instruction in hardware as discussed above with respect to FIG. 2.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The present invention includes any novel feature or combination of features disclosed herein either explicitly or any generalization thereof irrespective of whether or not it relates to the claimed invention or mitigates any or all of the problems addressed.

The invention claimed is:

1. A method of calculating a Cyclic Redundancy Check (CRC) value for a multi-bit input data word, using a defined generator polynomial having a length, the method comprising:
   a) serially shifting at least a portion of the input data word into a register;
   b) XORing contents of the register with the generator polynomial if an LSB of the register is '1';
   c) shifting the contents of the register right by one position;
   d) shifting into an MSB position of the register a new bit of the input data word, having been XORed with the LSB of the register;
   e) repeating step d) for all message data bits of the input data word;
   f) shifting into the register a number of '0's equal to the length of the generator polynomial; and
   g) reading from the register the calculated CRC value.

2. The method of claim 1, further comprising generating a pseudo-random noise (PN) sequence using the calculated CRC value.

3. The method of claim 1, further comprising Turbo coding input data using the calculated CRC value.

4. The method of claim 1, further comprising convolutionally coding input data using the calculated CRC value.

5. An apparatus for calculating a Cyclic Redundancy Check (CRC) value for a multi-bit input data word, using a defined generator polynomial having a length, comprising:
   a register for serially receiving at least a portion of the input data word;
   an XOR gate for XORing contents of the register with the generator polynomial if an LSB of the register is '1';
   means for shifting the contents of the register right by one position;
   means for repeatedly shifting into an MSB position of the register a new bit of the input data word, having been XORed with the LSB of the register, until all bits of the input data word have been shifted into the register; and
   means for shifting into the register a number of '0's equal to the length of the generator polynomial.

6. A microprocessor unit for calculating a Cyclic Redundancy Check (CRC) value for a multi-bit input data word, using a defined generator polynomial having a length, comprising:
   a register for serially receiving at least a portion of the input data word;
   an XOR gate for XORing contents of the register with the generator polynomial if an LSB of the register is '1';
   first means for shifting the contents of the register right by one position;
   second means for repeatedly shifting into an MSB position of the register a new bit of the input data word, having been XORed with the LSB of the register, until all bits of the input data word have been shifted into the register; and
   third means for shifting into the register a number of '0's equal to the length of the generator polynomial.

7. A microprocessor unit according to claim 6 wherein the register, XOR gate, and first, second, and third means are part of an apparatus for calculating the CRC value that is arranged to be operated in response to a single instruction.

8. A method of calculating a check value for a multi-bit input data word, using a defined generator polynomial having a length, the method comprising:
   serially shifting at least a portion of the input data word into a register;
   XORing contents of the register with the generator polynomial if a bit in a first bit position of the register is a first value;
   shifting the contents of the register by one position;
   serially shifting into a second bit position of the register a new bit of the input data word, the new bit having been XORed with a bit in the first bit position of the register;
   shifting into the register a number of second values; and
   reading from the register the calculated check value.

9. The method of claim 8, further comprising generating a pseudo-random noise (PN) sequence using the calculated check value.

10. The method of claim 8, further comprising Turbo coding input data using the calculated check value.

11. The method of claim 8, further comprising convolutionally coding input data using the calculated check value.

* * * * *